United States Patent
Okuda et al.

(10) Patent No.: US 8,455,833 B2
(45) Date of Patent: Jun. 4, 2013

(54) SINGLE CRYSTAL SCINTILLATOR MATERIAL, METHOD FOR PRODUCING SAME, RADIATION DETECTOR AND PET SYSTEM

(75) Inventors: Hiroyuki Okuda, Osaka (JP); Naoyuki Okamoto, Osaka (JP); Shinroh Itoh, Osaka (JP)

(73) Assignee: Hitachi Metals, Ltd., Tokyo (JP)

( * ) Notice: Subject to any disclaimer, the term of this patent is extended or adjusted under 35 U.S.C. 154(b) by 302 days.

(21) Appl. No.: 13/120,217

(22) PCT Filed: Sep. 28, 2009

(86) PCT No.: PCT/JP2009/004939
§ 371 (c)(1),
(2), (4) Date: Mar. 22, 2011

(87) PCT Pub. No.: WO2010/035500
PCT Pub. Date: Apr. 1, 2010

(65) Prior Publication Data
US 2011/0176657 A1    Jul. 21, 2011

(30) Foreign Application Priority Data

Sep. 29, 2008  (JP) ................... 2008-250978
Dec. 25, 2008  (JP) ................... 2008-329041

(51) Int. Cl.
*G01T 1/164*   (2006.01)
(52) U.S. Cl.
USPC ................... 250/363.02; 250/363.03
(58) Field of Classification Search
USPC ................... 250/363.02
See application file for complete search history.

(56) References Cited

U.S. PATENT DOCUMENTS

| | | |
|---|---|---|
| 2003/0159643 A1 | 8/2003 | Sumiya et al. |
| 2005/0236582 A1 | 10/2005 | Nakatsu |
| 2010/0207029 A1 | 8/2010 | Okuda et al. |

FOREIGN PATENT DOCUMENTS

| | | | |
|---|---|---|---|
| JP | 09-048697 A | | 2/1997 |
| JP | 2006-052372 A | | 2/2006 |
| JP | 2006052372 A | * | 2/2006 |
| WO | 2007/099772 A1 | | 9/2007 |

OTHER PUBLICATIONS

English translation of Official Communication issued in corresponding International Application PCT/JP2009/004939, mailed on May 19, 2011.
Official Communication issued in International Patent Application No. PCT/JP2009/004939, mailed on Oct. 27, 2009.
Van Eijk, "Inorganic-Scintillator Development," Nuclear Instruments and Method in Physics Research A, vol. 460, 2001, pp. 1-14.

* cited by examiner

*Primary Examiner* — Marcus Taningco
(74) *Attorney, Agent, or Firm* — Keating & Bennett, LLP

(57) ABSTRACT

A method for producing a single crystal scintillator material according to the present invention includes the steps of: providing a solvent including: at least one element selected from the group consisting of Li, Na, K, Rb and Cs; W and/or Mo; B; and oxygen; melting a Ce compound and a Lu compound that have been mixed with the solvent by heating the mixture to a temperature of 800° C. to 1,350° C.; and growing a single crystal by cooling the compounds melted. The single crystal is represented by the compositional formula $(Ce_xLu_{1-x})BO_3$, in which the mole fraction x of Ce satisfies $0.0001 \leq x \leq 0.05$.

16 Claims, 9 Drawing Sheets

SINGLE CRYSTAL SCINTILLATOR MATERIAL, METHOD FOR PRODUCING SAME, RADIATION DETECTOR AND PET SYSTEM

TECHNICAL FIELD

The present invention relates to a single crystal scintillator material for use in a positron emission tomography scanner and a method for producing such a material.

BACKGROUND ART

Recently, in the field of medical care, diagnosis using a positron emission tomography (which will be abbreviated herein as "PET") scanner has been carried out more and more often. Thus, to realize a PET scanner with even higher performance, searches for better scintillator materials have been conducted.

The scintillator materials for use to make a PET scanner need to detect a γ ray. To meet those needs, single crystal scintillator materials, including BGO (bismuth germanium oxide), LSO (lutetium silicon oxide), GSO (gadolinium silicon oxide) and LYSO (lutetium yttrium silicon oxide), have been used so far to make a PET scanner. The properties of a scintillator material are evaluated by its emission intensity (i.e., fluorescence output), fluorescence decay time, and energy resolution, for example. All of the single crystal materials mentioned above have properties that are good enough to use them to make a PET scanner. And as for a method of growing such a single crystal, a melt growth process such a Czochralski process or a Bridgman process has been used extensively on an industrial basis.

To make the PET more popular, however, the throughput of the diagnosis should be increased. But the throughput cannot be increased unless a single crystal scintillator material, of which the intensity of emission is greater than, but the fluorescence decay time is shorter than, conventional scintillator materials, is developed.

Patent Document No. 1 discloses GSO activated with a dopant Ce (cerium). On the other hand, Patent Documents Nos. 2 and 3 disclose cerium doped lutetium borate materials. Cerium doped lutetium borate has a high intensity of emission and a short fluorescence decay time, and therefore, is considered a promising scintillator material. Patent Document No. 3 also suggests that the cerium doped lutetium borate material be applied to the field of PET. However, the cerium doped lutetium borate material disclosed in that document is just powder. Thus, a single crystal of cerium doped lutetium borate that is big enough to use it in the PET cannot be formed by the method disclosed in Patent Document No. 2 or 3.

As for lutetium borate, its phase transition point (of about 1,350° C.) that involves a significant volumetric change is located in a lower temperature range than its melting point (of 1,650° C.). That is why according to a conventional single crystal growing process, in which the starting material should be heated to a temperature that is high enough to melt or dissolve the material, when the melt being cooled passes the phase transition point, its volume will expand so much that the crystal will collapse, which is a serious problem. Patent Document No. 4 discloses a method for producing a single crystal scintillator material by checking the phase transition of a crystalline material with element Sc, Ga or In added to a lutetium borate material. However, a lutetium borate based single crystal formed by the method disclosed in Patent Document No. 4 would also cause some deterioration such as a decrease in density or emission intensity due to the introduction of the additive element.

In order to overcome these problems, the applicant of the present application discloses a cerium doped lutetium borate single crystal formed by a flux method that uses a lead borate solvent in PCT/JP2008/1717 (filed on Jul. 1, 2008).

CITATION LIST

Patent Literature

Patent Document No. 1: Japanese Patent Application Laid-Open Publication No. 2003-300795
Patent Document No. 2: Japanese Patent Application Laid-Open Publication No. 2005
Patent Document No. 3: Japanese Patent Application Laid-Open Publication No. 2006-52372
Patent Document No. 4: Japanese Patent Application Laid-Open Publication No. 2007-224214

SUMMARY OF INVENTION

Technical Problem

By adopting the method disclosed in PCT/JP2008/1717, a cerium doped lutetium borate single crystal material with a calcite type crystal structure can be obtained by a simple method without adding an element such as Sc. According to this method, however, a very small amount of the solvent component could enter the cerium doped lutetium borate single crystal produced and might prevent the single crystal from exhibiting its essential property. With that in mind, the present inventors carried out our researches in order to produce a cerium doped lutetium borate single crystal using some solvent other than the lead borate one.

It is therefore an object of the present invention to provide a single crystal scintillator material that achieves a higher intensity of emission and better fluorescence decay properties than conventional ones, a method for producing such a material, a radiation detector and a PET scanner.

Solution to Problem

A method for producing a single crystal scintillator material according to the present invention includes the steps of: providing a solvent including: at least one element selected from the group consisting of Li, Na, K, Rb and Cs; W and/or Mo; B; and oxygen; melting a Ce compound and a Lu compound that have been mixed with the solvent by heating the mixture to a temperature of 800° C. to 1,350° C.; and growing a single crystal by cooling the compounds melted. The single crystal is represented by the compositional formula ($Ce_x Lu_{1-x}$)$BO_3$, in which the mole fraction x of Ce satisfies $0.0001 \leq x \leq 0.05$.

In one preferred embodiment, the step of providing the solvent and the step of melting the compounds are the step of mixing the compound that forms the solvent, the Ce compound and the Lu compound together and heating the mixture to a temperature of 800° C. to 1,350° C.

In another preferred embodiment, the mole fraction x of Ce satisfies $0.001 \leq x \leq 0.03$.

In another preferred embodiment, the step of growing the single crystal is performed by TSSG process.

In still another preferred embodiment, the step of growing the single crystal includes cooling the melted compounds to a temperature of 750° C. to less than 1350° C. at a temperature decrease rate of 0.001° C. per hour to 5° C. per hour.

In a specific preferred embodiment, the step of growing is carried out in at least 80 hours.

A single crystal scintillator material according to the present invention includes a single crystal portion represented by the compositional formula $(Ce_xLu_{1-x})BO_3$, in which the mole fraction x of Ce satisfies $0.0001 \leq x \leq 0.05$. The content of Pb in the single crystal portion is 50 ppm by mass or less. That is to say, at a unit mass (100%) of this single crystal portion, the content of Pb is reduced to 50 ppm by mass or less.

In one preferred embodiment, the mole fraction x of Ce satisfies $0.001 \leq x \leq 0.03$.

In another preferred embodiment, the single crystal portion has a calcite type crystal structure.

In still another preferred embodiment, when mirror-polished to a thickness of 0.5 mm, the single crystal portion has a transmittance of at least 20% at a wavelength of 270 nm.

A radiation detector according to the present invention includes a single crystal scintillator material according to any of the preferred embodiments of the present invention described above, and a detector for detecting an emission from the single crystal scintillator material.

A PET scanner according to the present invention includes a number of radiation detectors, which are arranged in a ring, and detects a γ ray that has been radiated from a subject. Each of the radiation detectors is the radiation detector of the present invention.

Advantageous Effects of Invention

The present invention provides a colorless and transparent single crystal scintillator material that no coloring impurities have entered and that has a higher emission intensity than a conventional one.

DESCRIPTION OF EMBODIMENTS

Figure 1:
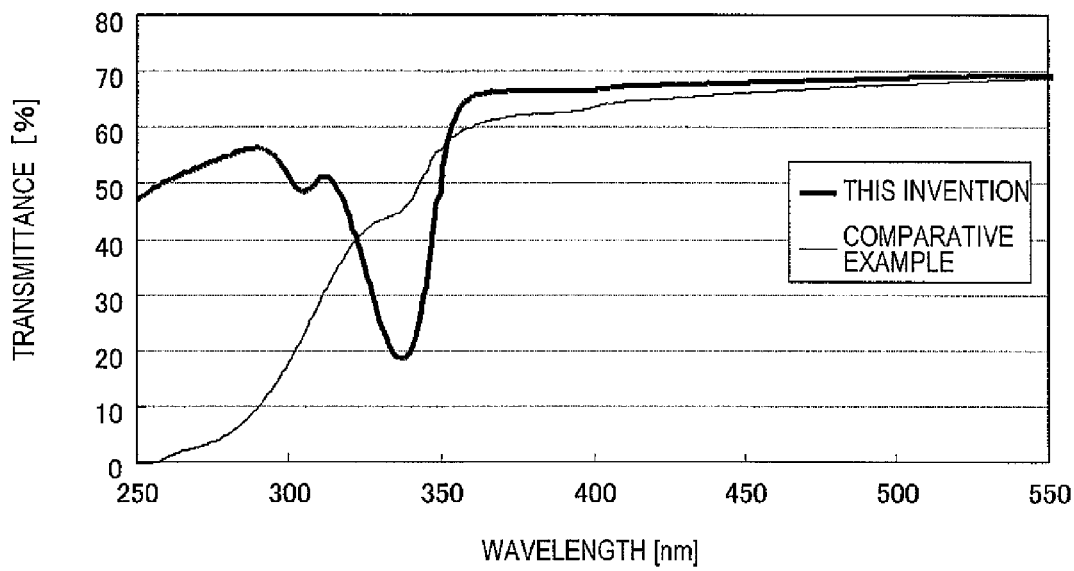
FIG. 1 is a graph showing the respective transmittances of a single crystal according to the present invention and a comparative example.

A method for producing a single crystal scintillator material according to the present invention includes the steps of: providing a solvent including: at least one element selected from the group consisting of Li, Na, K, Rb and Cs; W and/or Mo; B; and oxygen; melting a Ce compound and a Lu compound that have been mixed with the solvent by heating the mixture to a temperature of 800° C. to 1,350° C.; and growing a single crystal by cooling the compounds melted. The single crystal is represented by the compositional formula $(Ce_xLu_{1-x})BO_3$, in which the mole fraction x of Ce satisfies $0.0001 \leq x \leq 0.05$. More particularly, the method preferably includes the step of growing the single crystal at a temperature that is lower than the phase transition point of cerium doped lutetium borate from a high temperature vaterite phase into a calcite phase.

The solvent for use in the manufacturing process of the present invention includes not only at least one alkali metal selected from the group consisting of Li, Na, K, Rb and Cs but also W and/or Mo, B, and of the solvent, it is preferred that two or more alkali metals be included, and Li and Na can be used effectively for that purpose. It is known that those alkali metals and their compounds have very similar properties. That is why even if K, Rb and/or Cs is/are used, the same effect can be achieved as in a situation where Li and Na are used.

The solvent for use in the manufacturing process of the present invention further includes W and/or Mo as element(s) to form a low melting point compound with the alkali metals. To increase the density of the solvent toward that of the single crystal material produced, the low melting point compound is preferably formed between an element with a greater atomic weight and the alkali metals. For that reason, W is preferred to Mo. Nevertheless, as Mo is a heavy element that belongs to the same group as W and its property is similar to that of W, the same effect would be achieved even if Mo were used along with, or instead of, W.

B included in the solvent is an essential element for a single crystal component to produce. Also, B forms a borate with an alkali metal and forms part of the solvent.

After source materials to be single crystal components, including the Ce and Lu compounds, have been melted in the solvent, the mixture is slowly cooled to deposit a single crystal.

According to the manufacturing process of the present invention, a single crystal scintillator material, including a colorless and transparent single crystal portion that is represented by the compositional formula $(Ce_xLu_{1-x})BO_3$, in which the mole fraction x of Ce satisfies $0.0001 \leq x \leq 0.05$, can be obtained. Once grown and deposited, the single crystal portion of the present invention typically has a roughly plate shape but may also have any other shape if necessary.

It should be noted that typically all of the single crystal scintillator material of the present invention consists of the "single crystal portion". However, the single crystal scintillator material of the present invention could also include a non-single crystal portion (such as a polycrystalline portion) or could be covered with a protective coating, for example.

Lutetium borate activated with a rare-earth element as a dopant will exhibit scintillation property (i.e., will absorb a radiation such as an X-ray and emit an ultraviolet ray or a visible ray). Among other things, Ce-doped lutetium borate can be a very good scintillator material because it has a high intensity of emission and a short fluorescence decay time.

In the compositional formula described above, the mole fraction x represents the percentage of Ce that should replace the Lu sites. If the mole fraction x were less than 0.0001, the percentage of the emissive element Ce would be too small to produce emission with sufficient intensity. On the other hand, if the mole fraction x were greater than 0.05, then the transmittance would decrease so much as to decrease the intensity of the emission produced, too. According to the present invention, a greater percentage of Ce can replace Lu compared to the method disclosed in PCT/JP2008/1717, and therefore, the mole fraction x can be equal to or greater than 0.001 and can even be 0.003 or more. Nevertheless, it is more preferred that the mole fraction x be no greater than 0.03. Consequently, the preferred range of the mole fraction x is $0.001 \leq x \leq 0.03$.

In a preferred embodiment of the present invention, the single crystal scintillator material is doped with Ce substantially uniformly over the entire single crystal and satisfies the mole fraction range described above in each and every region of each single crystal. As a result, the entire single crystal can have the intended dopant Ce concentration and can exhibit good fluorescence decay properties as a whole.

The single crystal of lutetium borate has a calcite structure in a temperature range that is lower than a phase transition point of around 1,350° C. but has a vaterite structure at temperatures exceeding the phase transition point. As will be described later, according to the present invention, a single crystal is grown and deposited by dissolving the lutetium borate based material in a solvent at a temperature of 1,350° C. or less and then cooling the material dissolved, and therefore, no significant volumetric change should occur due to a phase transition during the cooling process. As a result, the single crystal of lutetium borate with the calcite structure can be grown thickly.

The single crystal scintillator material of the present invention thus prepared has high transmittance with respect to visible radiation. For example, a single crystal with a thickness of 2 mm or less will have as high a transmittance as 50% or more at a peak of its emission wavelength. A peak value of the emission wavelength will vary according to the composition of the single crystal. As for a single crystal of Ce-doped lutetium borate that satisfies the mole fraction range described above, a peak of its emission wavelength will fall within the range of 350 nm to 450 nm.

Also, the single crystal scintillator material of the present invention is characterized by having a sufficiently high transmittance in the short wavelength range of 250 nm to 300 nm. FIG. 1 is a graph showing, in comparison, the respective transmittances of the single crystal scintillator material (representing Example 3) of the present invention (which is indicated by the bold curve) and a single crystal scintillator material (representing Comparative Example 1) that was made by the method disclosed in PCT/JP2008/1717.

As can be seen from FIG. 1, the single crystal scintillator material of the present invention had a local minimum around a wavelength of 340 nm but had relatively high values in the other wavelength ranges. Also, in the single crystal scintillator material of the present invention, the transmittance in the short wavelength range of 250 nm to 300 nm was higher than at that wavelength of 340 nm.

On the other hand, the single crystal scintillator material that was made by the method disclosed in PCT/JP2008/1717 had transmittances that decreased monotonically in that short wavelength range of 350 nm or less as the wavelength decreased. Such a decrease in transmittance in this comparative example was caused by Pb included in that single crystal scintillator material. As can be seen, even if a single crystal scintillator material has a composition represented by the compositional formula $(Ce_xLu_{1-x})BO_3$, in which the mole fraction x of Ce satisfies $0.0001 \leq x \leq 0.05$, its transmittance could vary significantly with the content of Pb. Since the content of lead can be reduced to 50 ppm by mass or less according to the present invention, a transmittance of at least 20% (and preferably 30% or more) can be achieved at a wavelength of 270 nm, which is located approximately at the middle of the wavelength range of 250 nm to 300 nm.

The "transmittance" is defined herein to be the ratio of the intensity of the outgoing light (i.e., the light that has left a sample) to that of the light that has been incident on the sample and that is supposed to be 100. Specifically, the transmittance is measured in the following manner.

Samples of measurement are obtained by dicing a single crystal scintillator material parallel to its (001) planes and mirror-polishing and planarizing their surface so that the samples have a surface roughness of 0.005 μm or less and a thickness of 0.5 mm. In general, the transmittance is affected by not only absorption inside a sample but also reflection from the surface of the sample. By adjusting the surface roughness of the samples to such a range, however, the degrees of influence of reflection from the respective samples can be regarded as approximately equal to each other. That is why by measuring the transmittances of such samples that have been adjusted as described above, the absorption properties of those samples can be compared to each other sufficiently accurately. The transmittances may be measured with an ultraviolet and visible spectrophotometer.

Hereinafter, it will be described in further detail how to produce the single crystal scintillator material of the present invention.

As described above, the single crystal of lutetium borate has a vaterite structure at temperatures exceeding a phase transition point of around 1,350° C. but has a calcite structure in a temperature range that is lower than the phase transition point. According to the conventional single crystal growing process, the material needs to be melted by being heated to such a high temperature that the temperature of a crystal that has been deposited by cooling the melt will inevitably pass that phase transition point during the cooling process. As a result, the volume of that crystal deposited will change significantly as a result of phase transition and the crystal will collapse. That is why it has been very difficult to make a single crystal of lutetium borate having a phase transition point that is lower than its melting point.

The flux method that uses lead borate as a solvent as disclosed in PCT/JP2008/1717 mentioned above is a very good method that can overcome such a problem by contributing to making easily single crystals of cerium doped lutetium borate that would be difficult to make by any conventional method.

The single crystals of cerium doped lutetium borate made by such a method, however, are slightly yellowish. According to a result of the analysis the present inventors carried out, those single crystals would have turned slightly yellowish due to unexpected presence of a very small amount of lead, which is a component of the solvent. The unwanted presence of lead would also affect the intensity of emission produced by the single crystals obtained.

To overcome such a problem, the present inventors further researched a solvent to be used in the flux method. As a result, we arrived at the conclusion that if a solvent including an alkali metal such as Li, W and/or Mo as a metal that would form a low-melting compound with that alkali metal, B and oxygen is used as a main solvent and if a lutetium borate based material is dissolved in such a solvent at a temperature lower than the phase transition point and then slowly cooled, single crystals of a cerium doped lutetium borate based material should be deposited. According to the present invention, nothing but that lead that is already included as an inevitable impurity in the starting material will be present in the resultant material, and therefore, a colorless and transparent single crystal scintillator material, of which the content of lead is 50 ppm by mass or less, can be obtained.

Hereinafter, a method for producing a single crystal scintillator material according to the present invention will be described in detail.

Starting Materials Including Lutetium Borate Based Material and Solvent

The starting material is a mixture of a compound of an alkali metal that is selected from the group consisting of Li, Na, K, Rb and Cs, a compound of W and/or Mo, a boron compound, a Ce compound and a Lu compound that have been mixed together to have a predetermined composition.

As a compound of the alkali metal, a carbonate salt, a hydrogen carbonate salt, a hydroxide or an oxide such as $Li_2CO_3$, $NaHCO_3$, $KOH$ or $Cs_2O$ may be used. Among these compounds, a carbonate is particularly preferred because it is easier to handle. As a compound of the alkali metal, an alkali halide such as NaCl, KBr, LiF or CsI may also be used. The alkali halide may be used either by itself or in combination with an alkali carbonate, for example. To lower the melting point of a compound to be a solvent, it is preferred that at least two different alkali metals be mixed together.

As the compound of W and/or Mo, $WO_3$ or $MoO_3$ may be used. The boron compound may be $B_2O_3$ or $H_3BO_3$, for example.

Examples of preferred Ce compounds include $CeO_2$, $Ce(OH)_3$ and $Ce_2O_3$. Among other things, $CeO_2$ and $Ce_2O_3$ are particularly preferred because these compounds are mass-produced with high purity and are easily available anywhere. $Lu_2O_3$ is preferably used as the Lu compound.

These starting materials are compounded together to have the following ratios. First of all, boron and W and/or Mo are compounded together to have a molar ratio of 10:90 to 80:20 and to make a solvent. To grow a larger crystal, boron and W and/or Mo are preferably compounded together to have a molar ratio of 30:70 to 60:40. On the other hand, the alkali metal is preferably compounded at a ratio of 0.5 mol to 2 mol with respect to 1 mol of W and/or Mo and boron combined.

Optionally, the solvent may include at least one compound selected from the group consisting of alkaline-earth metal compounds such as $BaCO_3$, $SrCO_3$ and $CaCO_3$ (which will be referred to herein as "$BaCO_3$, etc.") for the purpose of adjusting the melting point or the viscosity. If the solvent includes $BaCO_3$, etc., then $BaCO_3$, etc. is preferably compounded at a ratio of 0.1 mol with respect to 1 mol of the alkali metal.

This solvent and the respective compounds are mixed together so that Lu has a ratio of 0.002 to 0.3 mol with respect to 1 mol of the alkali metal and that Ce has a ratio of 0.0001 to 0.5 mol with respect to 1 mol of Lu. It is more preferred that this solvent and the respective compounds are mixed together so that Lu has a ratio of 0.02 to 0.3 mol with respect to 1 mol of the alkali metal and that Ce has a ratio of 0.0001 to 0.5 mol with respect to 1 mol of Lu. If this mixture continues to be heated, the respective compounds that form the solvent soon gets melted, thus dissolving Lu and Ce compounds in the molten solvent. Alternatively, $Na_2WO_4$, $Li_2B_2O_4$ or any other suitable compound that has been prepared in advance separately may also be used as the starting material and the solvent and the respective compounds may be compounded together to have the composition described above.

Control of Crystal Growing Temperature (1) Increasing Temperature and Maintaining the Increased Temperature The starting materials described above are heated to a temperature of 800° C. to 1,350° C. (which is the phase transition point of lutetium borate) or less at a temperature increase rate of 50° C. per hour to 500° C. per hour and then that temperature is maintained for one to twelve hours, thereby melting the overall mixture. Although lutetium borate has a melting point of 1,650° C., it is dissolved in this example in the solvent that has been melted at a temperature falling within that range, which is lower than 1,650° C. That is why a single crystal with a calcite structure can be deposited without passing the phase transition point of the crystal during the cooling process.

In this process step of increasing the temperature and maintaining the increased temperature, the temperature may be once raised to beyond the one to be maintained, and then the temperature may be maintained within that range. Still alternatively, the temperature may also be increased in multiple steps with the temperature increase rate varied from a relatively high one to a relatively low one.

If the temperature to be maintained and then decreased (slowly) for the purpose of crystal growth is 1,350° C. (which is the phase transition point) or less, then the temperature may be once raised to 1,350° C. or more and then a temperature of less than 1,350° C. may be maintained as well.

Once the mixture of the Ce compound, the Lu compound and the solvent is heated to a temperature that is higher than 1,350° C. but that is equal to or lower than the boiling point of lutetium borate, all of these compounds will be melted in the solvent that has turned into a liquid phase when passing a temperature of 500° C. to 1,350° C. For example, even if temperature is once raised to 1,400° C., the melting process step itself will be done while the temperature is being increased.

(2) Cooling

Subsequently, the molten and dissolved material is slowly cooled from the maintained temperature (of 800° C. to 1,350° C.) to a lower temperature of 750° C. to less than 1,350° C. (such a temperature range will be referred to herein as a "first slow cooling process temperature range") preferably at a rate of 0.001° C. per hour to 5° C. per hour, more preferably at a rate of 0.003° C. per hour to 2° C. per hour. By performing the first cooling process as such a slow cooling process at a low rate, the crystal deposited can be grown thickly. To promote the crystal growth during the slow cooling process, a temperature of 800° C. to less than 1,350° C. may be maintained for 30 minutes or more. Also, in order to grow the crystal more thickly, in the first slow cooling process temperature range, slow cooling is preferably done in multiple steps with the cooling rate varied from a relatively low one to a relatively high one.

After the slow cooling process has been performed in the first slow cooling process temperature range and before the molten and dissolved material reaches a temperature of 500° C. to 800° C. (such a temperature range will be referred to herein as a "second slow cooling process temperature range"), the slow cooling process may be performed at a rate of 0.01° C. per hour to 30° C. per hour, preferably at a rate of 0.1° C. per hour to 20° C. per hour. When the slow cooling process(es) is/are finished (i.e., either when only the first slow cooling process is done or when the first and second slow cooling processes are both done), the cooling process may be carried out at a relatively high temperature decrease rate of 50° C. per hour to 300° C. per hour.

Such a temperature control does not always have to be done so that all of the molten and dissolved material has the same temperature. But at least a part of the molten and dissolved material where the crystal should be deposited needs to have its temperature controlled as described above. Optionally, in order to control the size of the crystal grown, for example, part of the molten and dissolved material may be controlled to have a different temperature. For instance, if a part that should have a crystal grown is controlled to the temperature range described above but if the other part that should not have a crystal grown is controlled to a higher temperature range, a crystal can be grown thickly. Also, even when a method that uses a seed material such as the TSSG process to be described later is adopted, not the entire molten and dissolved material in the crucible but only the seed material may have its temperature controlled.

A solidified solvent may have been deposited on the single crystal that either is still in the crucible or has been unloaded from the crucible. The solvent for use in the present invention has high solubility in water. That is why by either soaking the single crystal in water or washing the single crystal with running water, a cerium doped lutetium borate single crystal can be easily separated and removed from the solvent. Optionally, before the single crystal is separated, the molten solvent may be drained by heating again the mixture to a temperature of 500° C. to 700° C. and then the single crystal may be washed with water. Still alternatively, while a cooling process is being carried out to deposit and grow a single crystal, the mixture may be kept at a temperature of 500° C. to 700° C. (e.g., 550° C.) for several hours (e.g., five hours). After that, the single crystal may be unloaded, have the molten solvent drained and then be washed with water.

Crystal Growing Method

Examples of specific preferred crystal growing methods include a flux method (which is a kind of slow cooling process and also called a "temperature difference method"), the Bridgman process and the TSSG (top seeded solution growth) method. According to the TSSG method, a big crystal can be grown and the crystal grown can be separated easily from the solution. Hereinafter, it will be described with reference to FIG. 2 specifically how to grow a crystal by TSSG method.

Figure 2:
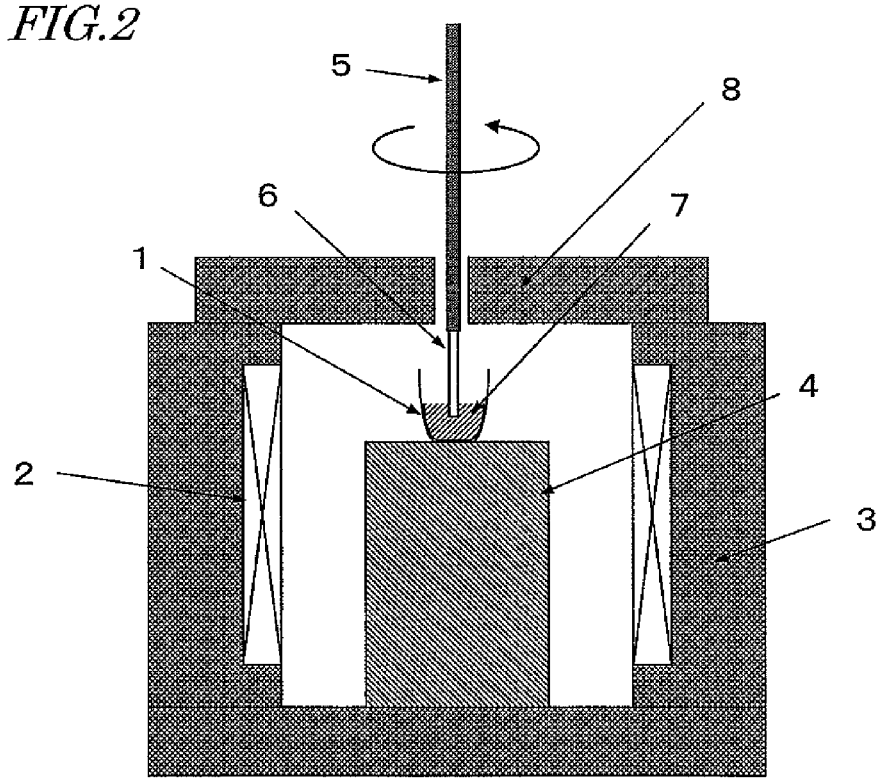
FIG. 2 illustrates a crystal grower for use in the present invention.

FIG. 2 illustrates a crystal grower for use to carry out the TSSG method. The apparatus shown in FIG. 2 includes an electric furnace 3, of which the temperature can be controlled with a heater 2. As shown in FIG. 2, a crucible 1 of platinum, containing a molten material 7, has been put on a crucible susceptor 4 inside the electric furnace 3. The apparatus with such a configuration dissolves the material, which has been prepared and then introduced into the crucible 1, by heating the material with the heater 2. A seed material 6 that has been put at the top of a seed shaft 5 is brought into contact with the molten material 7 and then either held there or raised to grow a crystal. As for the seed material 6, a crystal of the same kind as the crystal to grow is generally and preferably used. However, a different kind of crystal that is not easily dissolved in the molten material 7 or platinum, for example, is also used often as the seed material 6.

Also, to grow a big crystal, the size of the crucible needs to be increased. Nevertheless, when a large crucible is used, the melt is more likely to have an unintentional temperature or density distribution. And under such an environment, it is difficult to grow a crystal of quality with good reproducibility. To keep the melt always ready to grow a crystal by overcoming such a problem, the crystal growing process is preferably carried out with the melt stirred up.

A single crystal of cerium doped lutetium borate obtained by such a manufacturing process is a colorless and transparent hexagonal plate single crystal, of which the transmittance at a peak of its emission wavelength is 40% or more and where the presence of no coloring impurities can be confirmed, and has a calcite structure. When excited with an X-ray, the single crystal has a peak of emission wavelength of 365 nm to 410 nm and produces an emission, of which the intensity is 800% or more compared to BGO with the same volume. And even when compared to LYSO that achieves the highest emission intensity among various single crystal scintillator materials currently used, the emission intensity of the single crystal is 140% or more.

Another method for producing a single crystal scintillator material according to the present invention includes the steps of: providing a solvent including: at least one element selected from the group consisting of Li, Na, K, Rb and Cs; W and/or Mo; B; and oxygen; melting a Ce compound and a Lu compound that have been mixed with the solvent by heating the mixture to a temperature at which a single crystal represented by the compositional formula $(Ce_xLu_{1-x})BO_3$ that satisfies $0.0001 \leq x \leq 0.05$ does not make any phase transition involving a significant volumetric change from a high temperature vaterite phase into a calcite phase; and growing the single crystal represented by the compositional formula $(Ce_xLu_{1-x})BO_3$, in which the mole fraction x of Ce satisfies $0.0001 \leq x \leq 0.05$, by cooling the compounds melted.

The phase transition point is 1350° C. as described above. However, if the pressure applied to the molten compounds and solvent from the atmosphere is changed from an ordinary pressure, then the phase transition point will shift from 1,350° C. Likewise, even if an electric field is applied to the molten compounds and solvent, the phase transition point will also shift from 1,350° C. In those cases, the temperature to grow and deposit a crystal is set to be equal to or lower than the shifted phase transition point.

EXAMPLES

Example 1

Figure 3:
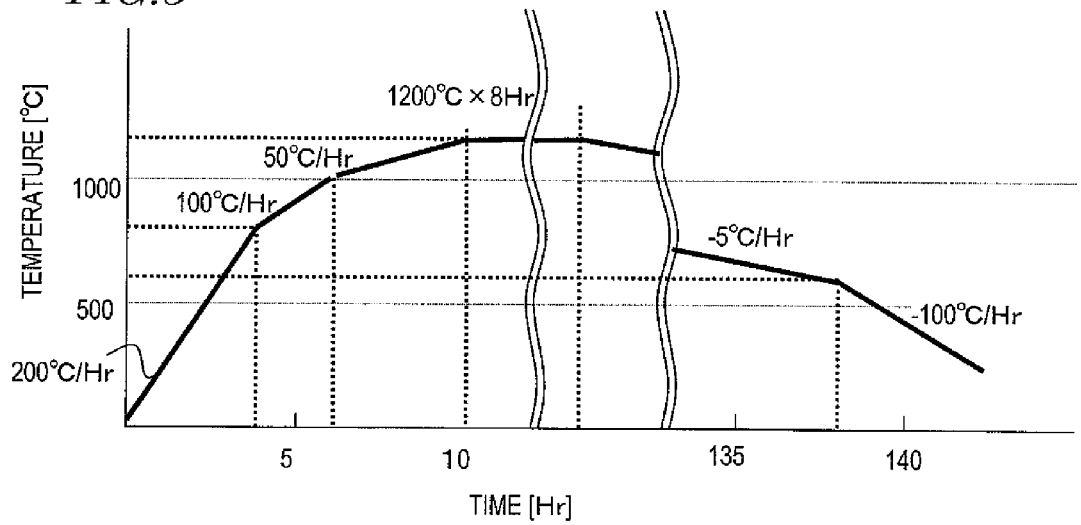
FIG. 3 is a graph showing a heat pattern for use to grow a crystal in Example 1 of the present invention.

In a first specific example of the present invention, a crystal was grown by the flux method (which is a kind of slow cooling process). A crucible of platinum with a diameter of 50 mm and a depth of 60 mm was provided. Meanwhile, 15.30 g of $Na_2CO_3$, 5.80 g of $Li_2CO_3$, 33.50 g of $WO_3$, 6.20 g of $B_2O_3$, 4.20 g of $Lu_2O_3$, and 0.02 g of $CeO_2$ were weighted and mixed together in a mortar, and then the mixture was put into the crucible. Then, the crucible of platinum was loaded into a crucible of alumina with a diameter of 60 mm and a depth of 70 mm. And the alumina crucible was capped to grow a crystal according to the heat pattern shown in FIG. 3, in which the ordinate represents the temperature and the abscissa represents the time. The middle phase of the cooling process is not shown there.

According to this specific example, the temperature was first increased to 800° C. at a rate of 200° C. per hour, increased next to 1,000° C. at a rate of 100° C. per hour, and then increased to 1,200° C. at a rate of 50° C. per hour. After the mixture was kept at 1,200° C. for 8 hours, its temperature was decreased to 600° C. at a rate of 5° C. per hour and then continued to be decreased at a rate of 100° C. per hour, as can be seen from FIG. 3.

From the mixture that had been melted and dissolved at a temperature of around 1,200° C., a crystal represented by the compositional formula $(Ce_xLu_{1-x})BO_3$ had grown by cooling.

After having been cooled, the solvent that had solidified in the crucible was washed away with water. Thereafter, the crystal remaining in the crucible was unloaded.

Figure 4:
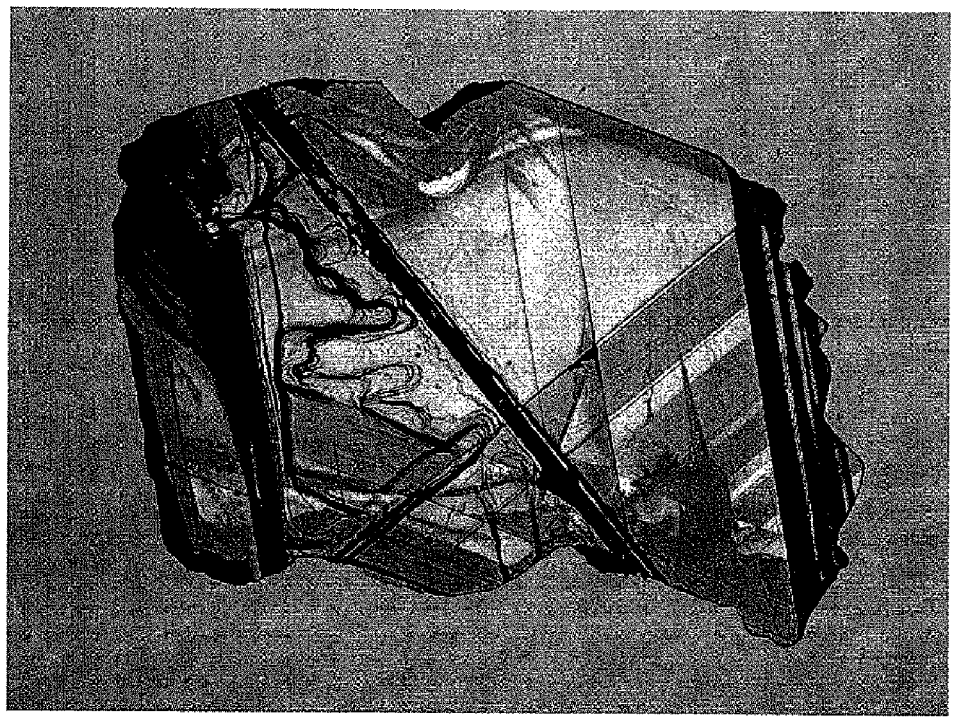
FIG. 4 is a photograph of a crystal that was obtained in Example 1 of the present invention.

FIG. 4 is a photograph showing a crystal thus obtained.

The crystal thus obtained was subjected to a measurement using an X-ray diffractometer. As a result, the present inventors confirmed that the crystal had an $LuBO_3$ calcite structure and didn't have a vaterite structure or any other phase. Also, the Ce concentration with respect to the sum of the rare-earth elements included in the crystal thus obtained was measured with an electron probe microanalyzer (EPMA). As a result, we confirmed that the Ce concentration was 0.1 at % or more in every region. That is to say, the Ce mole fraction x in the compositional formula $(Ce_xLu_{1-x})BO_3$ was 0.001 or more, which satisfied the inequality $0.0001 \leq x \leq 0.05$. Also, the content of Pb was measured by ICP emission spectrometry and turned out to be 50 ppm by mass or less.

Figure 5:
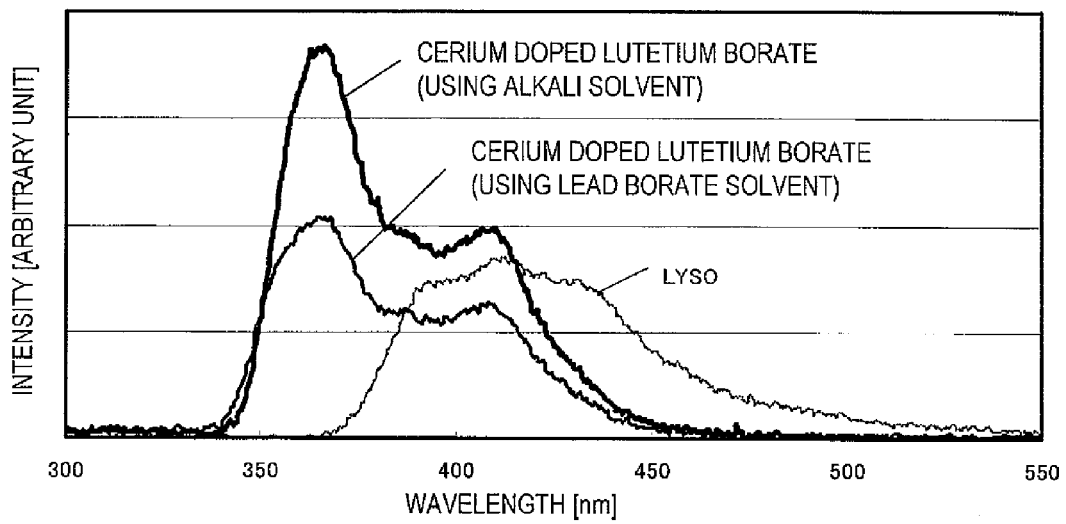
FIG. 5 is a graph showing the X-ray excited emission spectrum that was obtained by exciting a crystal representing a specific example of the present invention with an X-ray radiated from a CuKα ray source and making the crystal produce an emission.

FIG. 5 is a graph showing the X-ray excited emission spectrum that was obtained by exciting the crystal with an X-ray radiated from a CuKα ray source and making the crystal produce an emission. In FIG. 5, the data indicated by "alkali solvent" represents the spectrum of the crystal of this specific example. FIG. 5 also shows the X-ray excited emission spectrum of a cerium doped lutetium borate single crystal that was formed by the flux method using lead borate as a solvent as disclosed in PCT/JP2008/1717 (of which the data is indicated by "lead borate solvent") and that of LYSO (lutetium yttrium silicon oxide single crystal with a density of 7.1 g/cm$^3$) that was grown by CZ process.

As can be seen from FIG. 5, the peak of emission wavelength was 367 nm. Also, the intensity of the emission produced by this specific example was approximately 150% of that of the emission produced by the cerium doped lutetium borate single crystal that had been formed using a lead borate solvent and was approximately 140% of that of the emission produced by LYSO.

Example 2

In a second specific example of the present invention, a crystal was grown by the TSSG method using the apparatus shown in FIG. 2. A crucible 1 of platinum with a diameter of 50 mm and a depth of 50 mm was provided. Meanwhile, 25.50 g of $Na_2CO_3$, 9.60 g of $Li_2CO_3$, 55.90 g of $WO_3$, 10.30 g of $B_2O_3$, 7.10 g of $Lu_2O_3$, and 0.03 g of $CeO_2$ were weighted and mixed together in a mortar, and then the mixture was loaded into the crucible. Then, with the temperature of the crucible 1 controlled with a heater 2 surrounding the crucible 1, a crystal was grown according to the heat pattern shown in FIG. 6, in which the ordinate represents the temperature and the abscissa represents the time. The middle phase of the cooling process is not shown there, either.

Figure 6:
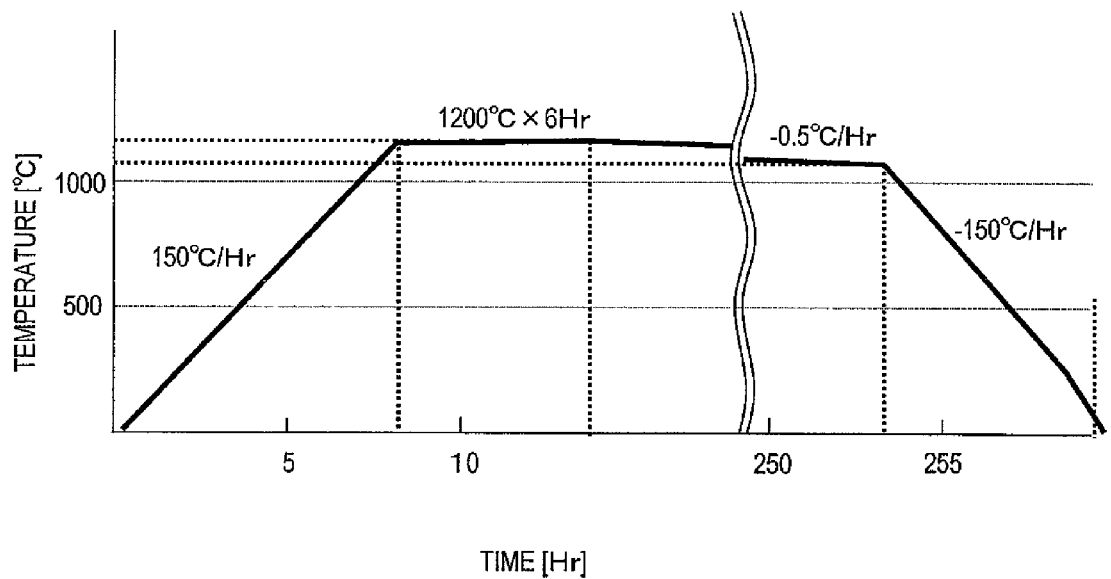
FIG. 6 is a graph showing a heat pattern for use to grow a crystal in Example 2 of the present invention.

As can be seen from FIG. 6, in this specific example, the temperature was first increased to 1,200° C. at a rate of 150° C. per hour and that temperature was maintained for two hours. Next, the seed material 6 (which was a lutetium borate crystal with a width of 3 mm and a thickness of 2 mm) that was put at the top of the seed shaft 5 being rotated at a frequency of 30 rpm was brought down from over the crucible into contact with the surface of the molten material. After the seed material 6 had been held there for four more hours, its temperature was decreased to 1,080° C. at a rate of 0.5° C. per hour. Thereafter, the seed material was withdrawn from the surface of the molten material by raising the seed shaft 5 and then its temperature was further decreased at a rate of 150° C. per hour.

At the top of the seed material that had been in contact with the molten material, a crystal represented by the compositional formula $(Ce_xLu_{1-x})BO_3$ had grown.

After having been cooled, the crystal grown was washed with running water to remove the solvent remaining there. And then the crystal was unloaded.

Figure 7:
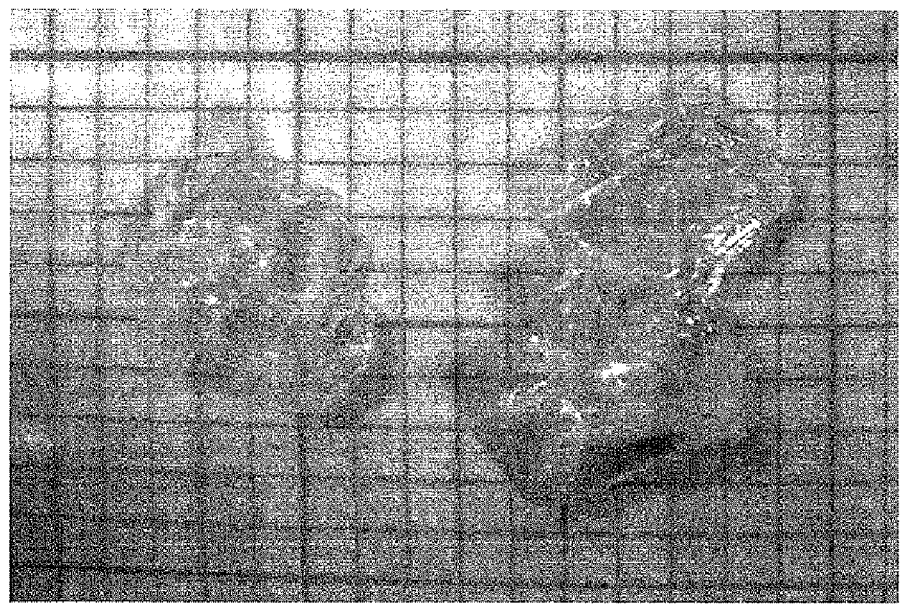
FIG. 7 is a photograph of a crystal that was obtained in Example 2 of the present invention.

FIG. 7 is a photograph showing crystals thus obtained. In FIG. 7, a grid is illustrated to indicate the sizes of the crystals, and the grid spacing (i.e., the size of each grid square) is 1 mm. As can be seen easily from FIG. 7, these crystals had a diagonal size of 5 mm or more and a thickness of 0.5 mm or more. As used herein, the "diagonal size" is supposed to be a length representing the maximum size of the crystal and the "thickness" is supposed to be a length representing the minimum size of the crystal.

The crystal thus obtained was subjected to a measurement using an X-ray diffractometer. As a result, the present inventors confirmed that the crystal had an $LuBO_3$ calcite structure and didn't have a vaterite structure or any other phase. Also, the Ce concentration with respect to the sum of the rare-earth elements included in the crystal thus obtained was measured with an electron probe microanalyzer (EPMA). As a result, we confirmed that the Ce concentration was 0.05 at % or more in every region. That is to say, the Ce mole fraction x in the compositional formula $(Ce_xLu_{1-x})BO_3$ was 0.0005, which satisfied the inequality $0.0001 \leq x \leq 0.05$.

Furthermore, the crystal as this specific example of the present invention was excited with an X-ray radiated from a CuKα ray source so as to produce an emission. As a result, the peak of emission wavelength was 365 nm.

Also, its transmittance at a wavelength of 270 nm was 53%, which the present inventors confirmed was more than 20%.

Example 3

In a third specific example of the present invention, a crystal was grown by the TSSG method using the apparatus shown in FIG. 2. A crucible 1 of platinum with a diameter of 50 mm and a depth of 50 mm was provided. Meanwhile, 19.80 g of $Na_2CO_3$, 13.80 g of $Li_2CO_3$, 57.70 g of $WO_3$, 9.30 g of $B_2O_3$, 3.50 g of $Lu_2O_3$, and 0.03 g of $CeO_2$ were weighted and mixed together in a mortar, and then the mixture was loaded into the crucible. Then, with the temperature of the crucible 1 controlled with a heater 2 surrounding the crucible 1, a crystal was grown according to the heat pattern shown in FIG. 8, in which the ordinate represents the temperature and the abscissa represents the time. The middle phase of the cooling process is not shown there, either.

Figure 8:
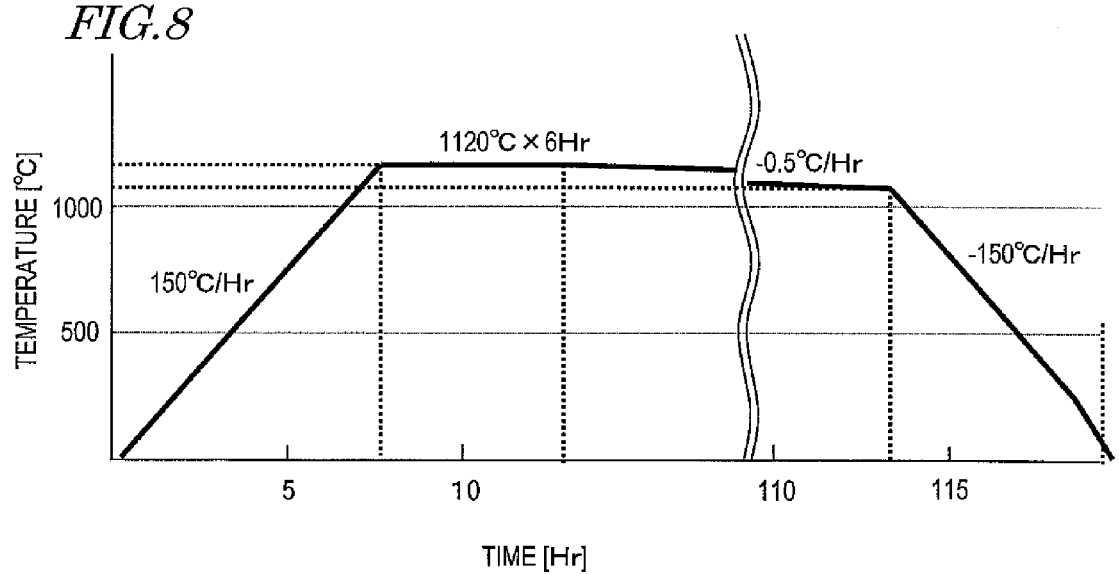
FIG. 8 is a graph showing a heat pattern for use to grow a crystal in Example 3 of the present invention.

As can be seen from FIG. 8, in this specific example, the temperature was first increased to 1,120° C. at a rate of 150° C. per hour and that temperature was maintained for two hours. Next, the seed material 6 (which was a lutetium borate crystal with a width of 3 mm and a thickness of 2 mm) that was put at the top of the seed shaft 5 being rotated at a frequency of 30 rpm was brought down from over the crucible into contact with the surface of the molten material. After the seed material 6 had been held there for four more hours, its temperature was decreased to 1,070° C. at a rate of 0.5° C. per hour. Thereafter, the seed material was withdrawn from the surface of the molten material by raising the seed shaft 5 and then its temperature was further decreased at a rate of 150° C. per hour.

At the top of the seed material that had been in contact with the molten material, a crystal represented by the compositional formula $(Ce_xLu_{1-x})BO_3$ had grown.

After having been cooled, the crystal grown was washed with running water to remove the solvent remaining there. And then the crystal was unloaded.

Figure 9:
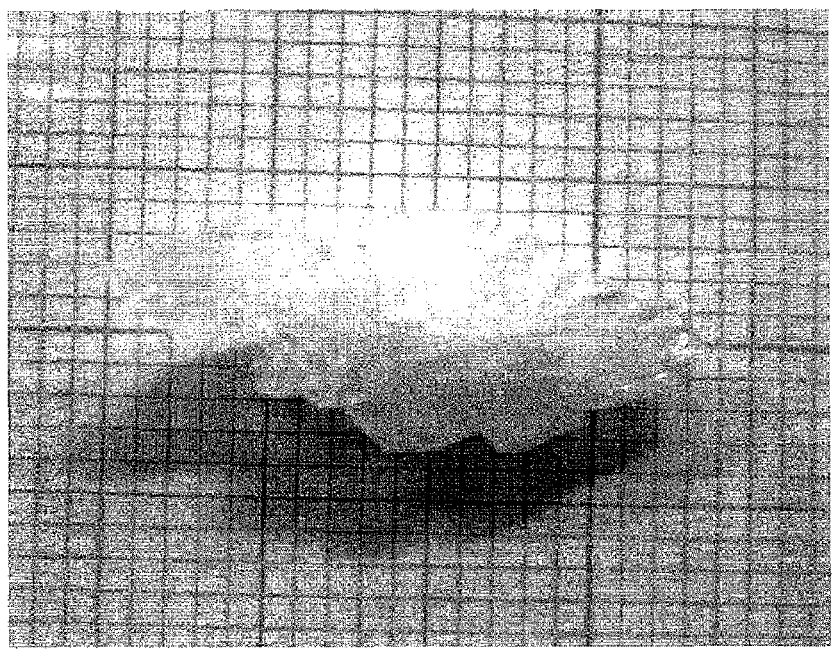
FIG. 9 is a photograph of a crystal that was obtained in Example 3 of the present invention.

FIG. 9 is a photograph showing a crystal thus obtained. In FIG. 9, a grid is illustrated to indicate the size of the crystal, and the grid spacing (i.e., the size of each grid square) is 1 mm. As can be seen easily from FIG. 9, this crystal had a diagonal size of 5 mm or more and a thickness of 0.5 mm or more.

The crystal thus obtained was subjected to a measurement using an X-ray diffractometer. As a result, the present inventors confirmed that the crystal had an $LuBO_3$ calcite structure and didn't have a vaterite structure or any other phase. Also, the Ce concentration with respect to the sum of the rare-earth elements included in the crystal thus obtained was measured with an electron probe microanalyzer (EPMA). As a result, we confirmed that the Ce concentration was 0.05 at % or more in every region. That is to say, the Ce mole fraction x in the compositional formula $(Ce_xLu_{1-x})BO_3$ was 0.0015, which satisfied the inequality $0.0001 \leq x \leq 0.05$. Also, the content of Pb was measured by ICP emission spectrometry and turned out to be 50 ppm by mass or less.

Furthermore, the crystal as this specific example of the present invention was excited with an X-ray radiated from a CuKα ray source so as to produce an emission. As a result, the peak of emission wavelength was 365 nm.

Also, the crystal thus obtained was diced parallel to its (001) planes and then subjected to a diamond lapping process, thereby obtaining a sample that had had its surface roughness adjusted to 5 nm or less and its thickness adjusted to 0.5 mm. Then, that sample got held by a sample holder, of which the hole had a diameter of 2 mm, and its transmittance was measured within a wavelength range of 250 nm to 550 nm using an ultraviolet and visible spectrophotometer (V-530 produced by JASCO Corporation). The results of this measurement are shown in FIG. 1. The transmittance at a wavelength of 270 nm was approximately 53%, which the present inventors confirmed was over 20%.

Comparative Example 1

In this comparative example, a crystal was grown by the flux method (which is a kind of slow cooling process). A crucible of platinum with a diameter of 45 mm and a depth of 50 mm was provided. Meanwhile, 32.00 g of $Na_2CO_3$, 28.00 g of $BaCO_3$, 10.60 g of $B_2O_3$, 4.20 g of $Lu_2O_3$, and 0.02 g of $CeO_2$ were weighted and mixed together in a mortar, and then the mixture was put into the crucible. Then, the crucible of platinum was loaded into a crucible of alumina with a diameter of 60 mm and a depth of 70 mm. And the alumina crucible was capped to grow a crystal according to the heat pattern shown in FIG. 3.

After having been cooled, the solvent that had solidified in the crucible was dissolved and washed away with water. Thereafter, the powder remaining in the crucible was unloaded. When the powder thus obtained was subjected to a measurement using an X-ray diffractometer. As a result, the present inventors confirmed that this powder was not $LuBO_3$. As Ba was used as a part of the solvent material instead of W and/or Mo, the intended $LuBO_3$ single crystal could not be obtained.

Comparative Example 2

In this comparative example, a crystal was grown by the TSSG method using the apparatus shown in FIG. 2. A crucible 1 of platinum with a diameter of 40 mm and a depth of 50 mm was provided. Meanwhile, 100 g of PbO, 18 g of $B_2O_3$, 10 g of $Lu_2O_3$, and 0.1 g of $CeO_2$ were weighted and mixed together in a mortar, and then the mixture was loaded into the crucible. Then, with the temperature of the crucible 1 controlled with a heater 2 surrounding the crucible 1, a crystal was grown according to the heat pattern shown in FIG. 10, in which the ordinate represents the temperature and the abscissa represents the time. The middle phase of the cooling process is not shown there, either.

Figure 10:
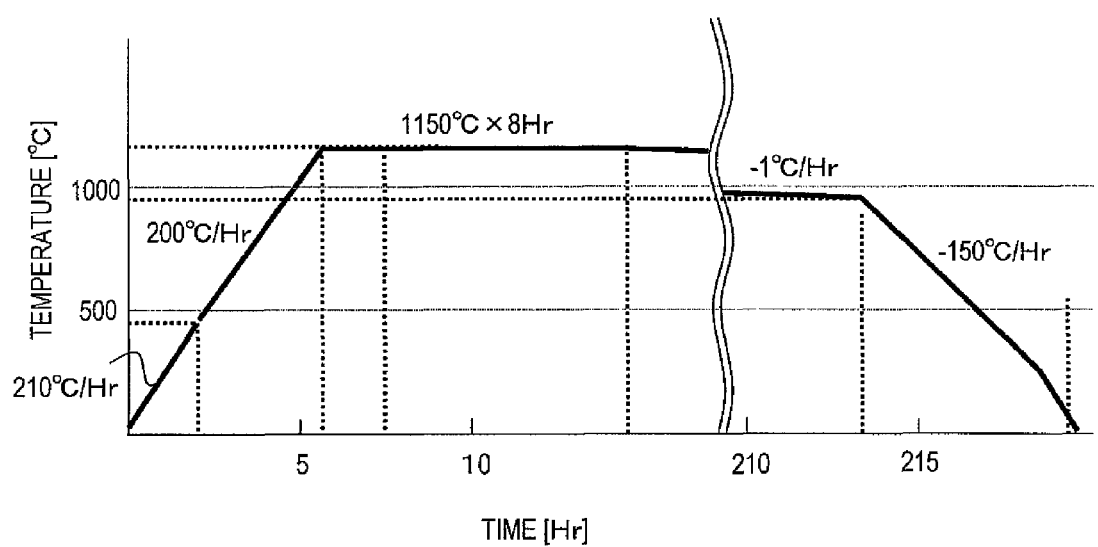
FIG. 10 is a graph showing a heat pattern for use to grow a crystal in Comparative Example 2 to be compared to the present invention.

As can be seen from FIG. 10, in this comparative example, the temperature was first increased to 450° C. at a rate of 210° C. per hour, next raised to 1,150° C. at a rate of 200° C. per hour, and then that temperature was maintained for two hours. Next, the seed material 6 (which was a platinum plate with a width of 5 mm and a thickness of 0.5 mm) that was put at the top of the seed shaft 5 being rotated at a frequency of 30 rpm was brought down from over the crucible into contact with the surface of the molten material. After the seed material 6 had been held there for six more hours, its temperature was decreased to 950° C. at a rate of 1° C. per hour. Thereafter, the platinum plate was withdrawn from the surface of the molten material by raising the seed shaft 5 and then its temperature was further decreased at a rate of 150° C. per hour.

At the top of the platinum plate that had been in contact with the molten material, a crystal represented by the compositional formula $(Ce_xLu_{1-x})BO_3$ had grown.

After having been cooled, the platinum plate and the crystal grown were rinsed with hydrochloric acid to remove the solvent remaining there. And then the crystal was unloaded.

The crystal thus obtained was subjected to a measurement using an X-ray diffractometer. As a result, the present inventors confirmed that the crystal had an $LuBO_3$ calcite structure. Also, the Ce concentration with respect to the sum of the rare-earth elements included in the crystal thus obtained was measured with an electron probe microanalyzer (EPMA). As a result, we confirmed that the Ce concentration was 0.05 at % or more in every region. That is to say, the Ce mole fraction x in the compositional formula $(Ce_xLu_{1-x})BO_3$ was 0.0005, which satisfied the inequality $0.0001 \leq x \leq 0.05$. Also, the content of Pb was measured by ICP emission spectrometry and turned out to be 400 ppm by mass.

Furthermore, the crystal of this comparative example was excited with an X-ray radiated from a CuKα ray source so as to produce an emission. As a result, the peak of emission wavelength was 365 nm. Also shown in FIG. 1 is the transmittance that was measured in the same way as in Example 3. The transmittance at a wavelength of 270 nm was approximately 3%. Thus, the present inventors confirmed that the transmittance decreased in a short wavelength range.

Example 4

In a fourth specific example of the present invention, a crystal was grown by the flux method (which is a kind of slow cooling process). A crucible of platinum with a diameter of 50 mm and a depth of 60 mm was provided. Meanwhile, 13.50 g of $K_2CO_3$, 14.43 g of $Li_2CO_3$, 39.41 g of $WO_3$, 3.64 g of $MoO_3$, 7.30 g of $B_2O_3$, 2.85 g of $Lu_2O_3$, and 0.01 g of $CeO_2$ were weighted. And then a crystal was grown in the same way as in Example 1. As a result, a cerium doped lutetium borate single crystal with a diagonal size of 5 mm and a thickness of 1 mm could be obtained. When subjected to the same measurement as in Example 3, this crystal had a calcite structure and didn't have a vaterite structure or any other phase. Also, the Ce mole fraction x in the compositional formula $(Ce_xLu_{1-x})BO_3$ of this crystal was 0.001 and the content of Pb was 50 ppm by mass or less. Further confirmed was that a peak of the emission wavelength was 365 nm and the transmittance at a wavelength of 270 nm was approximately 55%.

Example 5

In a fifth specific example of the present invention, a crystal was also grown by the flux method (which is a kind of slow cooling process). A crucible of platinum with a diameter of 50 mm and a depth of 60 mm was provided. Meanwhile, 9.90 g of $Na_2CO_3$, 6.90 g of $Li_2CO_3$, 17.92 g of $MoO_3$, 4.64 g of $B_2O_3$, 1.76 g of $Lu_2O_3$, and 0.02 g of $CeO_2$ were weighted. And then a crystal was grown in the same way as in Example 1. As a result, a cerium doped lutetium borate single crystal with a diagonal size of 5 mm and a thickness of 1 mm could be obtained. When subjected to the same measurement as in Example 3, this crystal had a calcite structure and didn't have a vaterite structure or any other phase. Also, the Ce mole fraction x in the compositional formula $(Ce_xLu_{1-x})BO_3$ of this crystal was 0.003 and the content of Pb was 50 ppm by mass or less. Further confirmed was that a peak of the emission wavelength was 365 nm and the transmittance at a wavelength of 270 nm was approximately 50%.

Example 6

In a sixth specific example of the present invention, a crystal was also grown by the flux method (which is a kind of slow cooling process). A crucible of platinum with a diameter of 50 mm and a depth of 60 mm was provided. Meanwhile, 13.69 g of $Na_2CO_3$, 28.05 g of $Cs_2CO_3$, 33.27 g of $WO_3$, 5.50 g of $B_2O_3$, 2.99 g of $Lu_2O_3$, and 0.01 g of $CeO_2$ were weighted. And then a crystal was grown in the same way as in Example 1. As a result, a cerium doped lutetium borate single crystal with a diagonal size of 5 mm and a thickness of 1 mm could be obtained. When subjected to the same measurement as in Example 3, this crystal had a calcite structure and didn't have a vaterite structure or any other phase. Also, the Ce mole fraction x in the compositional formula $(Ce_xLu_{1-x})BO_3$ of this crystal was 0.0005 and the content of Pb was 50 ppm by mass or less. Further confirmed was that a peak of the emission wavelength was 365 nm and the transmittance at a wavelength of 270 nm was approximately 55%.

Example 7

Figure 11:
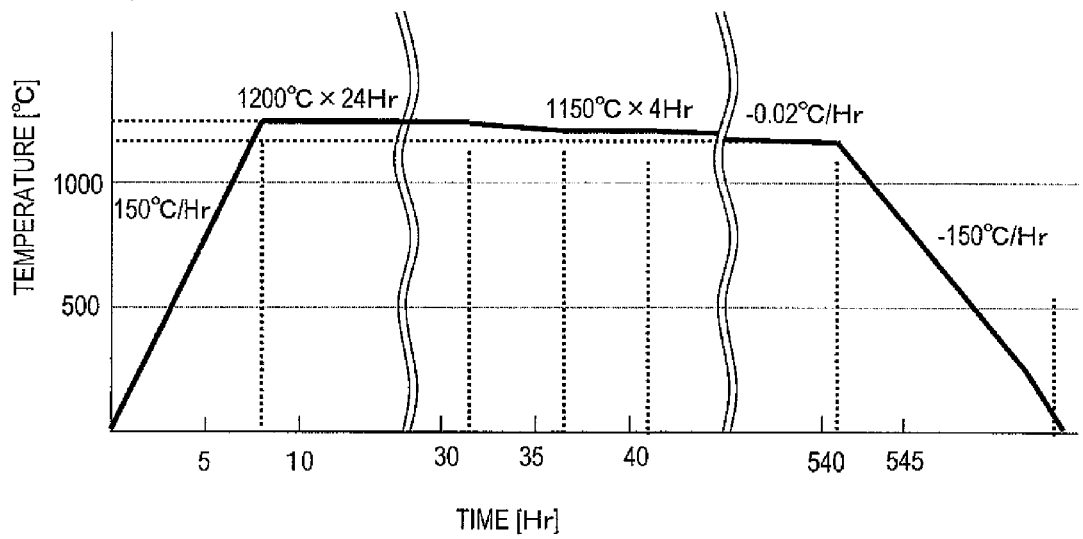
FIG. 11 is a graph showing a heat pattern for use to grow a crystal in Example 7 of the present invention.
Figure 12:
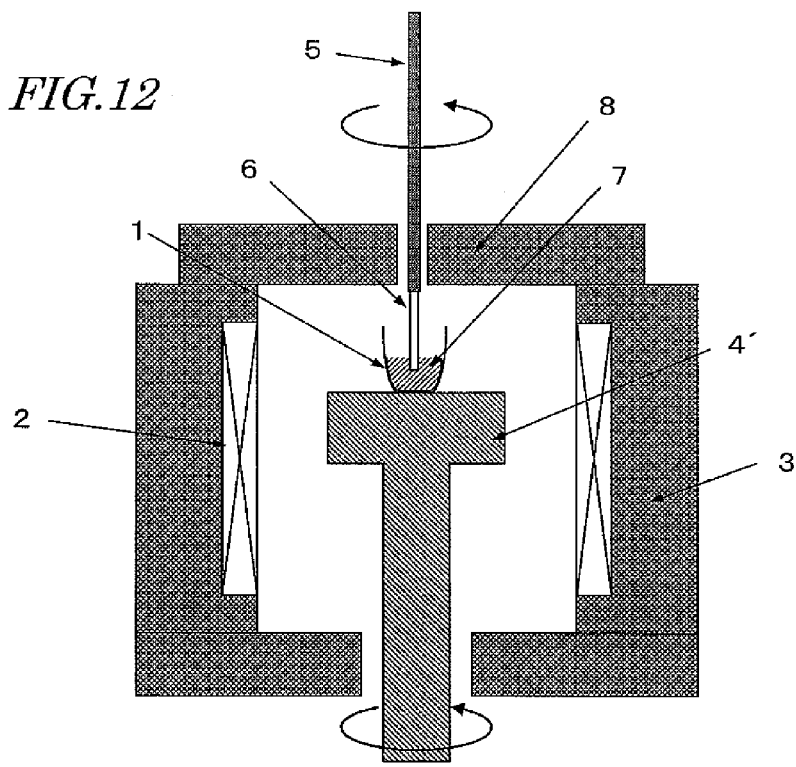
FIG. 12 illustrates an alternative crystal grower for use in the present invention.

In a seventh specific example of the present invention, a crystal was grown by the TSSG method. A crucible 1 of platinum with a diameter of 75 mm and a depth of 75 mm was provided. Meanwhile, 184.8 g of $Na_2CO_3$, 128.8 g of $Li_2CO_3$, 538.9 g of $WO_3$, 86.7 g of $B_2O_3$, 33.1 g of $Lu_2O_3$, and 0.1 g of $CeO_2$ were weighted and mixed together in a mortar, and then the mixture was loaded into the crucible. Then, with the temperature of the crucible 1 controlled with a heater 2 surrounding the crucible 1, a crystal was grown according to the heat pattern shown in FIG. 11, in which the ordinate represents the temperature and the abscissa represents the time. The middle phase of the cooling process is not shown there, either. A crystal grower that was used in this specific example to perform the TSSG process is shown in FIG. 12.

In this Example 7, a crystal was grown with the crucible susceptor 4' rotated at 30 rpm for 60 seconds and with its direction of rotation inverted at intervals of 30 seconds in order to stir up the molten material. Specifically, the temperature was first increased to 1,200° C. at a rate of 150° C. per hour and that temperature was maintained for 24 hours. Next, the temperature was decreased to 1,150° C. at a rate of 10° C. per hour, and that temperature was maintained fro two hours. Then, the seed material 6 (which was a lutetium borate crystal with a width of 5 mm and a thickness of 1 mm) that was put at the top of the seed shaft 5 that had started being rotated at 30 rpm in the opposite direction to the crucible and at the same time as the crucible was brought down from over the crucible into contact with the surface of the molten material. After the seed material 6 had been held there for two more hours, its temperature was decreased to 1,140° C. at a rate of 0.02° C. per hour. Thereafter, the crystal was withdrawn from the surface of the molten material by raising the seed shaft 5 and then its temperature was further decreased at a rate of 150° C. per hour. As a result, at the top of the seed material, a cerium doped lutetium borate single crystal had grown just as intended.

Figure 13:
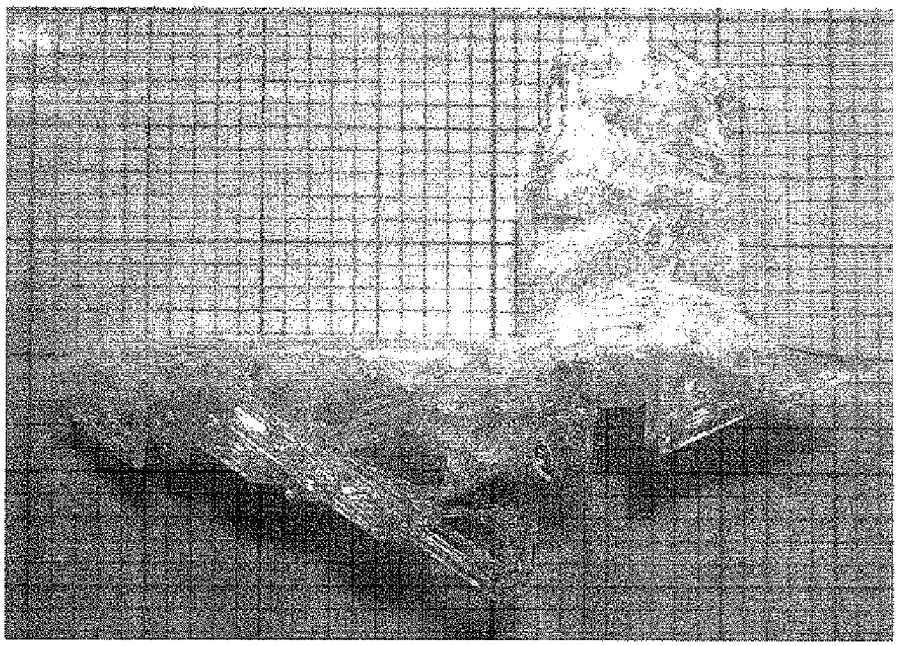
FIG. 13 is a photograph of a crystal that was obtained in Example 7 of the present invention.

FIG. 13 is a photograph showing a crystal thus obtained in this Example 7. The columnar portion shown on the upper right side is the seed material and the other portion is the crystal grown. This crystal had a diagonal size of 20 mm or more and a thickness of 1 mm. The grid spacing (i.e., the size of each grid square) is the same as in FIG. 7.

In the sample shown in FIG. 13, a single crystal portion, of which the size was at least equal to a 1 mm×1 mm×1 mm cube, could be cut out from a transparent part of the crystal. On the other hand, if an experiment was carried out with the condition changed so that a crystal being grown and deposited passed the phase transition point, the crystal collapsed to be powder, of which the size was far smaller than a 1 mm×1 mm×1 mm cube, and no single crystal portions were left.

The crystal thus obtained was subjected to a measurement in the same way as in Example 3. As a result, this crystal had a calcite structure and didn't have a vaterite structure or any other phase. Also, the Ce mole fraction x in the compositional formula $(Ce_xLu_{1-x})BO_3$ was 0.0005, and the content of Pb was 50 ppm by mass or less. Further confirmed was that a peak of the emission wavelength was 365 nm and the transmittance at a wavelength of 270 nm was approximately 55%.

Example 8

In an eighth specific example of the present invention, a crystal was grown in the same way as in Example 2 except that the apparatus shown in FIG. 12 was used. As a result, a cerium doped lutetium borate single crystal with a diagonal size of 20 mm and a thickness of 1.5 mm could be obtained. The crystal thus obtained was subjected to a measurement in the same way as in Example 3. As a result, this crystal had a calcite structure and didn't have a vaterite structure or any other phase. Also, the Ce mole fraction x in the compositional formula $(Ce_xLu_{1-x})BO_3$ was 0.001, and the content of Pb was 50 ppm by mass or less. Further confirmed was that a peak of the emission wavelength was 365 nm and the transmittance at a wavelength of 270 nm was approximately 55%.

Example 9

In a ninth specific example of the present invention, a crystal was grown in the same way as in Example 3 except that the apparatus shown in FIG. 12 was used. As a result, a cerium doped lutetium borate single crystal with a diagonal size of 20 mm and a thickness of 1.5 mm could be obtained. The crystal thus obtained was subjected to a measurement in the same way as in Example 3. As a result, this crystal had a calcite structure and didn't have a vaterite structure or any other phase. Also, the Ce mole fraction x in the compositional formula $(Ce_xLu_{1-x})BO_3$ was 0.002, and the content of Pb was 50 ppm by mass or less. Further confirmed was that a peak of the emission wavelength was 365 nm and the transmittance at a wavelength of 270 nm was approximately 55%.

Example 10

In a tenth specific example of the present invention, a crystal was also grown by the flux method (which is a kind of slow cooling process). A crucible of platinum with a diameter of 50 mm and a depth of 60 mm was provided. Meanwhile, 15.84 g of $Na_2CO_3$, 11.04 g of $Li_2CO_3$, 46.19 g of $WO_3$, 7.43 g of $B_2O_3$, 2.77 g of $Lu_2O_3$, and 0.07 g of $CeO_2$ were weighted. In this example, the temperature of the mixture was first increased to 1,200° C. at a rate of 200° C. per hour, decreased to 800° C. at a rate of 0.5° C. per hour and then further decreased at a rate of 150° C. per hour. After having been cooled, the solidified material in the crucible was washed with water to remove the solvent remaining there. And then the crystal left in the crucible was unloaded. As a result, a cerium doped lutetium borate single crystal with a diagonal size of 5 mm and a thickness of 1 mm could be obtained. When subjected to the same measurement as in Example 3, this crystal had a calcite structure and didn't have a vaterite structure or any other phase. Also, the Ce mole fraction x in the compositional formula $(Ce_xLu_{1-x})BO_3$ of this crystal was 0.006 and the content of Pb was 50 ppm by mass or less. Further confirmed was that a peak of the emission wavelength was 365 nm and the transmittance at a wavelength of 270 nm was approximately 45%.

Example 11

In an eleventh specific example of the present invention, a crystal was also grown by the flux method (which is a kind of slow cooling process). A crucible of platinum with a diameter of 50 mm and a depth of 60 mm was provided. Meanwhile, 23.49 g of $Li_2CO_3$, 49.14 g of $WO_3$, 7.87 g of $B_2O_3$, 2.77 g of $Lu_2O_3$, and 0.01 g of $CeO_2$ were weighted. In this example, the temperature of the mixture was first increased to 1,200° C. at a rate of 200° C. per hour, decreased to 1,135° C. at a rate of 0.5° C. per hour and then further decreased at a rate of 150° C. per hour. After having been cooled, the solidified material in the crucible was washed with water to remove the solvent remaining there. And then the crystal left in the crucible was unloaded. As a result, a cerium doped lutetium borate single crystal with a diagonal size of 5 mm and a thickness of 1 mm could be obtained. When subjected to the same measurement as in Example 3, this crystal had a calcite structure and didn't have a vaterite structure or any other phase. Also, the Ce mole fraction x in the compositional formula $(Ce_xLu_{1-x})BO_3$ of this crystal was 0.001 and the content of Pb was 50 ppm by mass or less. Further confirmed was that a peak of the emission wavelength was 365 nm and the transmittance at a wavelength of 270 nm was approximately 55%.

Example 12

In a twelfth specific example of the present invention, a crystal was also grown by the flux method (which is a kind of slow cooling process). A crucible of platinum with a diameter of 50 mm and a depth of 60 mm was provided. Meanwhile, 8.92 g of $Na_2CO_3$, 6.22 g of $Li_2CO_3$, 39.01 g of $WO_3$, 6.64 g of $B_2O_3$, 4.46 g of $Lu_2O_3$, and 0.02 g of $CeO_2$ were weighted. In this example, the temperature of the mixture was first increased to 1,200° C. at a rate of 200° C. per hour, decreased to 1,050° C. at a rate of 0.5° C. per hour and then further decreased at a rate of 150° C. per hour. After having been cooled, the solidified material in the crucible was washed with water to remove the solvent remaining there. And then the crystal left in the crucible was unloaded. As a result, a cerium doped lutetium borate single crystal with a diagonal size of 5 mm and a thickness of 1 mm could be obtained. When subjected to the same measurement as in Example 3, this crystal had a calcite structure and didn't have a vaterite structure or any other phase. Also, the Ce mole fraction x in the compositional formula $(Ce_xLu_{1-x})BO_3$ of this crystal was 0.001 and the content of Pb was 50 ppm by mass or less. Further confirmed was that a peak of the emission wavelength was 365 nm and the transmittance at a wavelength of 270 nm was approximately 55%.

Comparative Example 3

In this comparative example, a crystal was also grown by the flux method (which is a kind of slow cooling process). A crucible of platinum with a diameter of 50 mm and a depth of 60 mm was provided. Meanwhile, 20.31 g of $Na_2CO_3$, 14.15 g of $Li_2CO_3$, 22.21 g of $WO_3$, 3.98 g of $B_2O_3$, 3.66 g of $Lu_2O_3$, and 0.02 g of $CeO_2$ were weighted. Thereafter, a crystal was grown in the same way as in Example 12. After having been cooled, the solidified material in the crucible was washed with water to remove the solvent remaining there. But only a powder-like residue with a particle size of 0.1 mm or less was left there and the target crystal could not be obtained.

Comparative Example 4

In this comparative example, a crystal was also grown by the flux method (which is a kind of slow cooling process). A crucible of platinum with a diameter of 50 mm and a depth of 60 mm was provided. Meanwhile, 23.25 g of $Na_2CO_3$, 16.21 g of $Li_2CO_3$, 31.3 g of $B_2O_3$, 4.24 g of $Lu_2O_3$, and 0.02 g of $CeO_2$ were weighted. Thereafter, a crystal was grown in the same way as in Example 12. After having been cooled, the solidified material in the crucible was washed with water to remove the solvent remaining there. But only a powder-like residue with a particle size of 0.1 mm or less was left there and the target crystal could not be obtained.

Comparative Example 5

In this comparative example, a crystal was also grown by the flux method (which is a kind of slow cooling process). A crucible of platinum with a diameter of 50 mm and a depth of 60 mm was provided. Meanwhile, 9.88 g of $Na_2CO_3$, 6.89 g of $Li_2CO_3$, 43.23 g of $WO_3$, 3.81 g of $Lu_2O_3$, and 0.02 g of $CeO_2$ were weighted. Thereafter, a crystal was grown in the same way as in Example 12. After having been cooled, the solidified material in the crucible was washed with water to remove the solvent remaining there. But only a powder-like residue with a particle size of 0.1 mm or less was left there and the target crystal could not be obtained.

Figure 14:
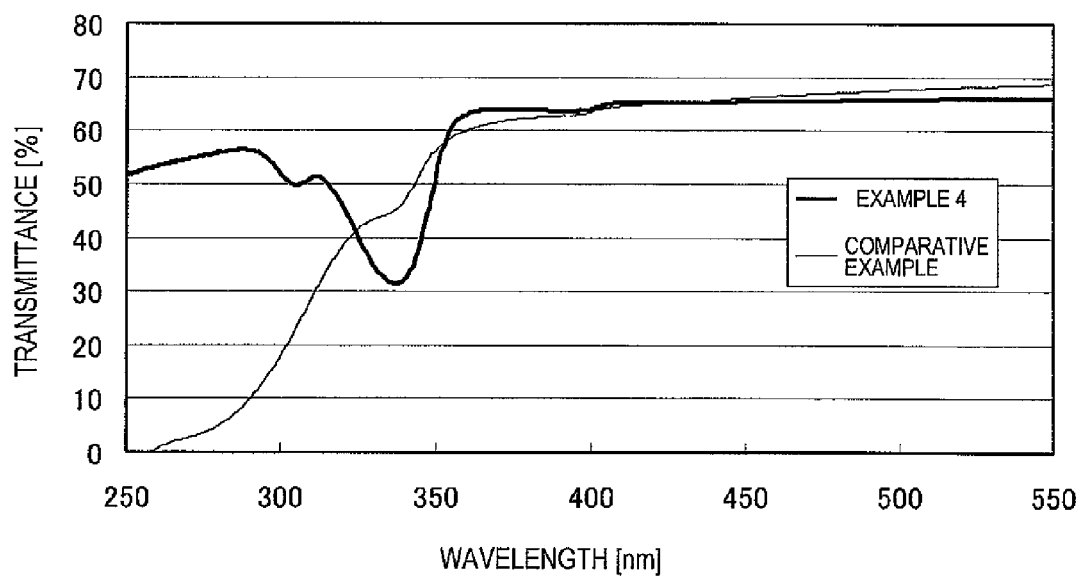
FIG. 14 is a graph showing the respective transmittances of a single crystal according to the present invention and a comparative example.

FIG. 14 is a graph showing the respective transmittances of the single crystal scintillator material (representing Example 4 that is indicated by the bold curve) of the present invention and its counterpart of Comparative Example 1. The transmittances were measured in the same way as when the data shown in FIG. 1 were collected.

As can be seen from FIG. 14, the local minimum value of Example 4 around a wavelength of 340 nm was higher than that of Example 3. Since the content of Pb can be reduced to 50 ppm by mass or less according to the present invention, a transmittance of 20% or more (and preferably 30% or more) could be achieved at a wavelength of 270 nm, which is located approximately at the middle of the wavelength range of 250 nm to 300 nm.

Figure 15:
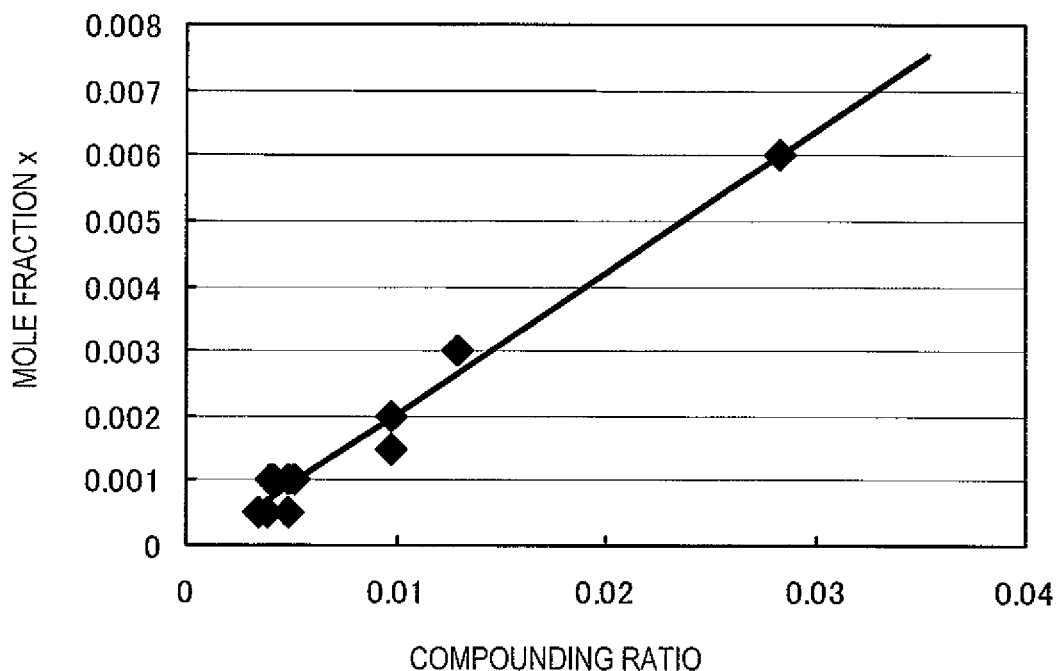
FIG. 15 is a graph showing how the Ce mole fraction x in the resultant composition varied with its compounding ratio in crystals of the present invention.

FIG. 15 is a graph showing a relation between the Ce compounding ratio and its mole fraction x in crystals representing specific examples of the present invention. As shown in FIG. 15, the data plotted are arranged in line and the compounding ratio and the mole fraction x have an almost linear relation. This result reveals that the mole fraction x can be controlled by adjusting the compounding ratio.

Figure 16:
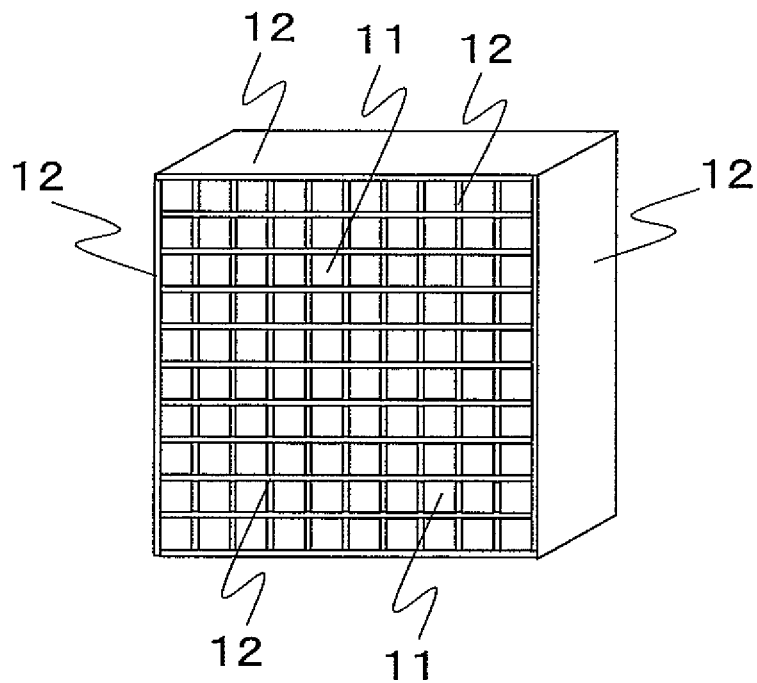
FIG. 16 is a perspective view illustrating an exemplary configuration for a scintillator array.

FIG. 16 is a perspective view illustrating an exemplary configuration for a scintillator array according to the present invention. In the exemplary configuration illustrated in FIG. 16, a number of bar scintillator crystals 11 are arranged to form a grid pattern (i.e., a checkerboard pattern) with a reflective member interposed. The respective scintillator crystals are made of the single crystal scintillator material of the present invention.

The gaps between adjacent ones of the scintillator crystals 11 are filled with the reflective member 12 and the outside surfaces of the scintillator array are also covered with the reflective member 12. In this preferred embodiment, the reflective member 12 is made of a material that transmits a γ ray but has a high reflectance at the wavelength of the light emitted from the scintillator crystal 11.

In this scintillator array, five out of the six outside surface are covered with the reflective member 12 but the other surface is not covered with the reflective member 12 but exposed. Specifically, one end facet of the scintillator crystals 11 is not covered with the reflective member 12, and therefore, can emit light through that end facet.

Figure 17:
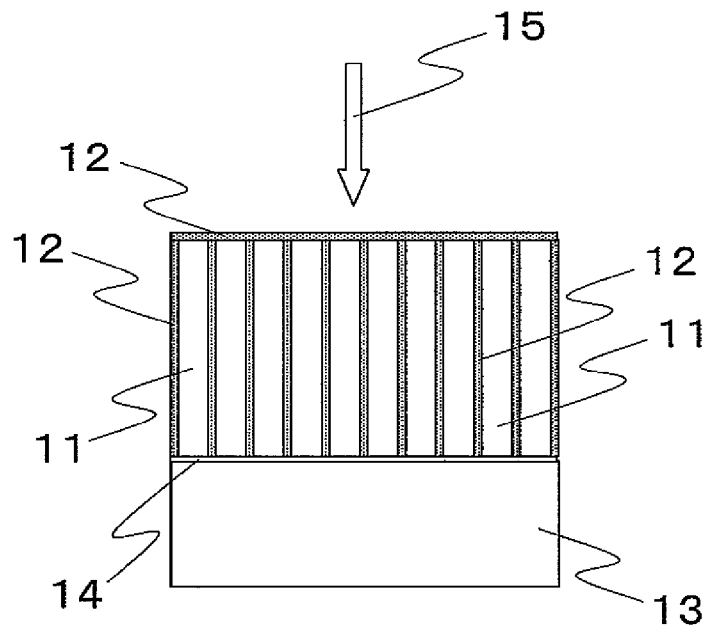
FIG. 17 is a cross-sectional view illustrating an exemplary configuration for a radiation detector according to the present invention.

FIG. 17 is a cross-sectional view illustrating an exemplary configuration for a radiation detector according to the present invention. This radiation detector includes the single crystal scintillator material of the present invention and a known sensor for sensing the emission from the single crystal scintillator material. In the example illustrated in FIG. 17, the radiation detector includes an array of the scintillator crystals 11 shown in FIG. 16 and a photomultiplier tube 13. Specifically, the scintillator array and the photomultiplier tube 13 are bonded together with an optical grease 14 so that one end face of the scintillator crystals 11 and the photosensitive plane of the photomultiplier tube 13 are optically coupled together. Another surface of the scintillator crystals 11 on which a γ ray 15 is incident is covered with the reflective member 12.

Figure 18:
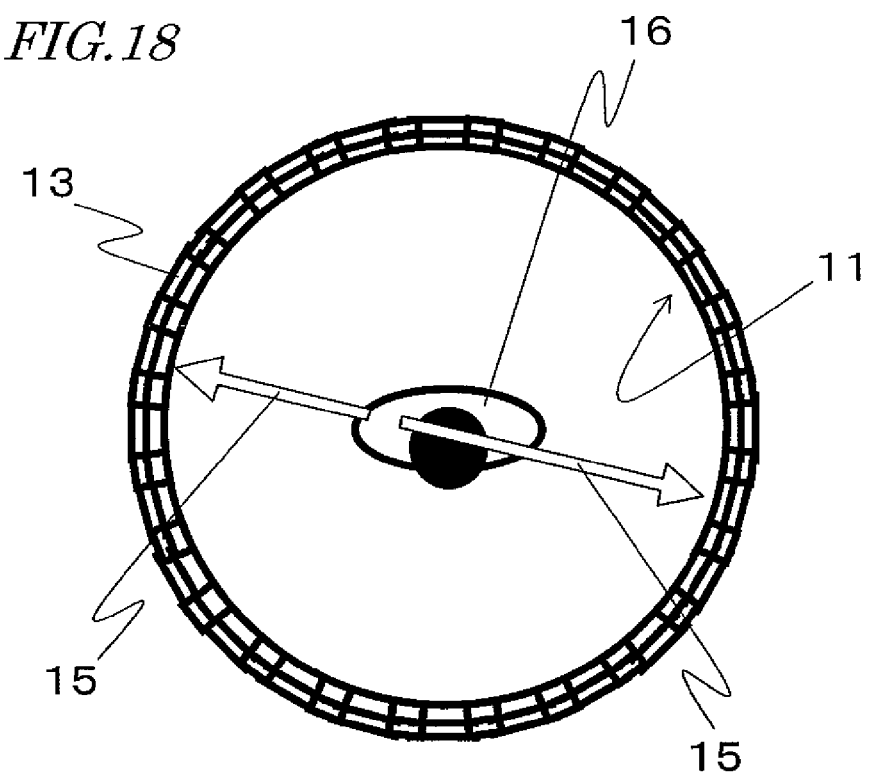
FIG. 18 illustrates an exemplary configuration for a PET scanner according to the present invention.

FIG. 18 illustrates an exemplary configuration for a PET scanner according to the present invention. A number of radiation detectors, each having the configuration shown in FIG. 17, are arranged in a ring.

Along the inner periphery of the ring, arranged are scintillator crystals 11 that are covered with the reflective member. On the other hand, photomultiplier tubes 13 are arranged along the outer periphery of the ring. And around the center of the ring, a subject 16 gets ready to be tested. A chemical agent labeled with a positron emitting radioactive element has been administered to the subject 16.

A pair of γ rays 15 are generated at the region of interest or diseased region of the subject 16 due to disappearance of positron and are emitted in two different directions. Those γ rays 15 are transformed by the scintillator crystals 11 into light, which is amplified by the photomultiplier tubes 13 and then detected as the output electrical signals of the photomultiplier tubes 13.

Industrial Applicability

The cerium doped lutetium borate single crystal scintillator material obtained by the manufacturing process of the present invention has a higher intensity of emission and better scintillator properties than any conventional single crystal scintillator material, and therefore, can be used effectively in a PET scanner.

Reference Signs List
1 crucible
2 heater
3 electric furnace
4 crucible susceptor
4' crucible susceptor
5 seed shaft
6 seed material
7 molten material
11 scintillator crystal
12 reflective member
13 photomultiplier tube (PMT)
14 optical grease
15 γ ray
16 subject

The invention claimed is:

1. A method for producing a single crystal scintillator material, the method comprising the steps of:
providing a solvent including: at least one element selected from the group consisting of Li, Na, K, Rb and Cs; W and/or Mo; B; and oxygen;
melting a Ce compound and a Lu compound that have been mixed with the solvent by heating the mixture to a temperature of 800° C. to 1,350° C.; and
growing a single crystal by cooling the compounds melted, the single crystal being represented by the compositional formula $(Ce_xLu_{1-x})BO_3$, in which the mole fraction x of Ce satisfies $0.0001 \leq x \leq 0.05$.

2. The method of claim 1, wherein the step of providing the solvent and the step of melting the compounds are the step of mixing the compound that forms the solvent, the Ce compound and the Lu compound together and heating the mixture to a temperature of 800° C. to 1,350° C.

3. A method for producing a single crystal scintillator material, the method comprising the steps of:
providing a solvent including: at least one element selected from the group consisting of Li, Na, K, Rb and Cs; W and/or Mo; B; and oxygen;
melting a Ce compound and a Lu compound that have been mixed with the solvent by heating the mixture; and
growing a single crystal by cooling the compounds melted, the single crystal being represented by the compositional formula $(Ce_xLu_{1-x})BO_3$, in which the mole fraction x of Ce satisfies $0.0001 \leq x \leq 0.05$,
wherein the single crystal is grown and deposited at a temperature that is lower than a phase transition point from a high temperature vaterite phase into a calcite phase.

4. The method of claim 1, wherein the mole fraction x of Ce satisfies $0.001 \leq x \leq 0.03$.

5. The method of claim 1, wherein the step of growing the single crystal is performed by TSSG process.

6. The method of claim 1, wherein the step of growing the single crystal includes cooling the melted compounds to a temperature of 750° C. to less than 1350° C. at a temperature decrease rate of 0.001° C. per hour to 5° C. per hour.

7. The method of claim 6, wherein the step of growing is carried out in at least 80 hours.

8. A single crystal scintillator material comprising a single crystal portion represented by the compositional formula $(Ce_xLu_{1-x})BO_3$, in which the mole fraction x of Ce satisfies $0.0001 \leq x \leq 0.05$, wherein the content of Pb in the single crystal portion is 50 ppm by mass or less.

9. The single crystal scintillator material of claim 8, wherein the mole fraction x of Ce satisfies $0.001 \leq x \leq 0.03$.

10. A radiation detector comprising
    the single crystal scintillator material of claim 9, and
    a detector for detecting an emission from the single crystal scintillator material.

11. The single crystal scintillator material of claim 8, wherein the single crystal portion has a calcite type crystal structure.

12. A radiation detector comprising
    the single crystal scintillator material of claim 11, and
    a detector for detecting an emission from the single crystal scintillator material.

13. The single crystal scintillator material of claim 8, wherein when mirror-polished to a thickness of 0.5 mm, the single crystal portion has a transmittance of at least 20% at a wavelength of 270 nm.

14. A radiation detector comprising
    the single crystal scintillator material of claim 13, and
    a detector for detecting an emission from the single crystal scintillator material.

15. A radiation detector comprising
    the single crystal scintillator material of claims 8, and
    a detector for detecting an emission from the single crystal scintillator material.

16. A PET scanner comprising a number of radiation detectors, which are arranged in a ring, and detecting a γ ray that has been radiated from a subject,
    wherein each of the radiation detectors is the radiation detector of claim 15.

* * * * *